(12) United States Patent  
Zhu et al.

(10) Patent No.: US 8,836,918 B2  
(45) Date of Patent: Sep. 16, 2014

(54) DUAL-STAGE EXCHANGE SYSTEM FOR LITHOGRAPHIC APPARATUS

(75) Inventors: Yu Zhu, Beijing (CN); Ming Zhang, Beijing (CN); Jingsong Wang, Beijing (CN); Li Tian, Beijing (CN); Dengfeng Xu, Beijing (CN); Wensheng Yin, Beijing (CN); Guanghong Duan, Beijing (CN); Jinchun Hu, Beijing (CN)

(73) Assignee: Tsinghua University, Beijing (CN)

( * ) Notice: Subject to any disclaimer, the term of this patent is extended or adjusted under 35 U.S.C. 154(b) by 456 days.

(21) Appl. No.: 13/262,783

(22) PCT Filed: Apr. 2, 2010

(86) PCT No.: PCT/CN2010/071540  
§ 371 (c)(1),  
(2), (4) Date: Dec. 14, 2011

(87) PCT Pub. No.: WO2010/111969  
PCT Pub. Date: Oct. 7, 2010

(65) Prior Publication Data  
US 2012/0099094 A1 Apr. 26, 2012

(30) Foreign Application Priority Data  
Apr. 3, 2009 (CN) .......................... 2009 1 0131505

(51) Int. Cl.  
*G03B 27/58* (2006.01)

(52) U.S. Cl.  
USPC ........................................................ 355/72

(58) Field of Classification Search  
CPC .................. G03F 7/70733; G03F 7/70758  
USPC ........................................................ 355/72  
See application file for complete search history.

(56) References Cited

U.S. PATENT DOCUMENTS 6,262,796 B1    7/2001  Loopstra et al.  
6,927,505 B2 *  8/2005  Binnard et al. ............ 310/12.01

(Continued)

FOREIGN PATENT DOCUMENTS

CN    1833309 A    9/2006  
CN    101101454 A   1/2008

(Continued)

OTHER PUBLICATIONS

Abstract of CN 101551598 A.*

(Continued)

*Primary Examiner* — Peter B Kim  
*Assistant Examiner* — Deoram Persaud

(57) ABSTRACT

A dual-stage exchange system for a lithographic apparatus comprises a silicon chip stage (10) operating in an exposure workstation (6) and a silicon chip stage (12) operating in a pre-processing workstation (7). Each silicon chip stage (10, 12) is supported by a six-freedom micro-motion stage, respectively. The silicon chip stage (10, 12) and the six-freedom micro-motion stage form a silicon chip stage group. The two silicon chip stage groups are provided on the same rectangular base stage (1) and suspended on an upper surface (2) of the base sage by air bearings. A double-freedom driving unit (21*a*, 21*b*, 22*a*, 22*b*) is provided on each edge of the base stage (1), respectively. The six-freedom micro-motion stage of the silicon chip stage group has an upper layer driver and a lower layer driver, capable of achieving six-freedom control. The double-freedom driving units (21*a*, 21*b*) on the long edges of the base stage are connected with the bases (62) of the six-freedom micro-motion stages, and the double-freedom driving units (22*a*, 22*b*) on the short edges of the base stage are connected with the stator coils (63) of the upper layer drivers of the six-freedom micro-motion stages.

6 Claims, 5 Drawing Sheets

(56) References Cited

U.S. PATENT DOCUMENTS

| | | | |
|---|---|---|---|
| 8,289,500 B2* | 10/2012 | Kiuchi | 355/77 |
| 2002/0196421 A1 | 12/2002 | Tanaka et al. | |
| 2006/0033043 A1 | 2/2006 | Arai | |
| 2006/0187431 A1 | 8/2006 | Shibazaki | |
| 2008/0151200 A1* | 6/2008 | Takaiwa | 355/30 |
| 2008/0285004 A1* | 11/2008 | Binnard et al. | 355/72 |
| 2009/0219503 A1* | 9/2009 | Li et al. | 355/74 |
| 2010/0045961 A1* | 2/2010 | Li et al. | 355/73 |
| 2010/0208227 A1* | 8/2010 | Zhu et al. | 355/72 |
| 2010/0245797 A1* | 9/2010 | Goodwin et al. | 355/72 |
| 2010/0297562 A1* | 11/2010 | Shibazaki | 430/325 |
| 2012/0099095 A1* | 4/2012 | Zhu et al. | 355/72 |
| 2012/0127448 A1* | 5/2012 | Zhu et al. | 355/72 |
| 2013/0038853 A1* | 2/2013 | Zhu et al. | 355/72 |

FOREIGN PATENT DOCUMENTS

| | | | |
|---|---|---|---|
| CN | WO 2009009947 A1 | 1/2009 |
| CN | 101551598 A | 10/2009 |
| EP | 1582932 A2 | 10/2005 |
| JP | 2005038874 | 2/2005 |
| JP | 2005353969 | 12/2005 |

OTHER PUBLICATIONS

Abstract of CN 101551598 A (Dec. 1, 2010).*

International Search Report for PCT/CN2010/071540 filed on Apr. 2, 2010.

* cited by examiner

DUAL-STAGE EXCHANGE SYSTEM FOR LITHOGRAPHIC APPARATUS

TECHNICAL FIELD

The present invention relates to a dual-stage exchange system for a lithographic apparatus, which is applied to a semiconductor lithographic apparatus and belongs to the field of semiconductor manufacturing equipments.

BACKGROUND

In the process of manufacturing integrated circuit chips, exposure and transfer (lithography) of a designed pattern for a chip on photoresist on a wafer surface is one of the most important steps which is implemented by an apparatus called lithographic apparatus (exposure device). The resolution and exposure efficiency of a lithographic apparatus greatly influence the characteristic linewidth (resolution) and productivity of IC chips. The motion accuracy and operation efficiency of an ultraprecise wafer moving and positioning system (hereinafter referred to as wafer stage), which is a critical system of lithographic apparatus, determine to a large extent the resolution and exposure efficiency of a lithographic apparatus.

The fundamental principle of a step-and-scan projection lithographic apparatus is shown in FIG. 1. Deep ultraviolet light from a light source 45 transmits through a mask 47 and a lens system 49 to image a part of pattern on the mask onto certain chip of a wafer 50. The mask and the wafer move synchronously in opposite directions with a certain velocity ratio so as to image the entire pattern on the mask onto the certain chip on the wafer.

The basic function of a wafer moving and positioning system is to carry a wafer and move at a preset speed and in a preset direction during exposure to allow precise transfer of a mask pattern to various areas on the wafer. Due to the small linewidth of chips (the smallest linewidth of 45 nm available presently), it is required that the wafer stage has extremely high moving and positioning accuracy in order to ensure overlay accuracy and resolution of lithography. Furthermore, since the movement velocity of wafer stage influences to a large extent the productivity of lithography, it is desired to further increase movement velocity of the wafer stage from the view point of increasing productivity.

For traditional wafer stages, such as those described in patents EP 0729073 and U.S. Pat. No. 5,996,437, only one wafer moving and positioning unit, i.e. one wafer stage, is disposed in each lithographic apparatus. Preparations, such as leveling and focusing, are all implemented on the stage, which are time consuming. Particularly, alignment requires a very long time, since it needs low velocity scanning (typical alignment scanning velocity is 1 mm/s) with extremely high accuracy. It is very difficult to decrease the operation time. Therefore, in order to improve productivity of lithographic apparatus, movement velocity of wafer stages during stepping and exposure scanning must be increased. However, increased velocity would inevitably lead to deterioration of dynamic performance of the system, and a lot of technical measures should be adopted to ensure and enhance movement accuracy of wafer stages, which will incur a much higher cost for retaining existing accuracy or achieving higher accuracy.

Patent WO 98/40791 (published on Sep. 17, 1998, Netherlands) described a structure with two wafer stages in which exposure preparation works, such as wafer loading and unloading, pre-alignment and alignment, are transferred to a second wafer stage that moves simultaneously with and independently from the exposure stage. While movement velocity of wafer stages is not increased, substantial preparation works carried out on the exposure stage are now carried out on the second wafer stage, which significantly reduces operation time of each wafer on the exposure stage, greatly improving productivity. However, the system has a major drawback of non-centroid driving for the wafer stage system.

Patent of invention titled "Dual-stage exchange system for Lithographic apparatus" filed by the applicant of the present application in 2007 (Publication No.: CN101101454) disclosed a dual-stage exchange system for lithographic apparatus, which has advantages such as simple structure and high space utilization and thereby improving exposure efficiency of lithographic apparatus. However, this two-stage system still suffers some problems. First of all, use of air bearing structures entails micron scale or higher accuracy for component processing and assembling. Secondly, there is a rigid requirement for consistency between external dimensions of wafer stages. Thirdly, it is difficult to mount a sensor for detecting positions with respect to each other between guides involved in exchange, and upper linear guides tend to collide.

SUMMARY

In view of the shortages and defects of prior art, the object of the present invention is to provide a novel dual-stage exchange system for a lithographic apparatus to overcome shortcomings of existing stage exchange system, such as complex structure and extremely high accuracy requirements for processing and assembling, the dual-stage exchange system of the present invention has simple structure, high space utilization and avoids collision between upper linear guides of bi-freedom driving unit during exchange, hence improving exposure efficiency of lithographic apparatus.

The technical solutions of the present invention are as follows:

A dual-stage exchange system for a lithographic apparatus, the system comprising a first wafer stage 10 operating at an exposure workstation 6 and a second wafer stage 12 operating at a pre-processing workstation 7, each of the wafer stages being borne by a 6-DOF micro-positioner respectively, a wafer stage and a 6-DOF micro-positioner constituting a stage group, the 6-DOF micro-positioner being driven by Lorentz motors, said two wafer stages being disposed on a top surface 2 of a rectangular base with long sides in X direction and short sides in Y direction, a first X 2-DOF driving unit 21*a* and a second X 2-DOF driving unit 21*b* being disposed on two long sides of the base 1 respectively, and a first Y 2-DOF driving unit 22*a* and a second Y 2-DOF driving unit 22*b* being disposed on two short sides of the base 1 respectively, the 2-DOF driving units being driven by upper linear motors and lower linear motors, characterized in that: the 6-DOF micro-positioner of each stage group has upper and under layers of drivers with the upper layer being horizontal direction driver and the under layer being vertical direction driver, the upper layer driver allows movements in X direction, in Y direction and rotation about Z axis, the under layer driver allows movements in Z direction, rotation about X axis and rotation about Y axis; a base of the 6-DOF micro-positioner 62 is fixed with a pushrod 35 of the first X 2-DOF driving unit 21*a*, and a stator coil 63 of the upper layer driver of the 6-DOF micro-positioner is fixed with a pushrod 35 of the first Y 2-DOF driving unit 22*a*;

The exchange process for the two stages of the system is as follows: upon exchange, firstly, stator coils 63 of upper layer drivers of the two stage groups' 6-DOF micro-positioners separate completely from rotor magnetic steels 64 of corresponding upper layer drivers respectively, the stator coils 63 of upper layer drivers of the two 6-DOF micro-positioners are not exchanged, the two wafer stages exchange positions, then, the stator coil 63 of the upper layer driver of the 6-DOF micro-positioner located at the exposure workstation is inserted into a gap of the rotor magnetic steel 64 of the upper layer driver of the 6-DOF micro-positioner that moved to the exposure workstation, the stator coil 63 of the upper layer driver of the 6-DOF micro-positioner located at the pre-processing workstation is inserted into a gap of the rotor magnetic steel 64 of the upper layer driver of the 6-DOF micro-positioner that moved to the pre-processing workstation, after that the system enters a next operating cycle.

A dual-stage exchange system for a lithographic apparatus, characterized in that: the upper layer driver of said 6-DOF micro-positioner uses at least 3 Lorentz electrical motors; and the under layer driver uses at least 3 Lorentz electrical motors.

A dual-stage exchange system for a lithographic apparatus, characterized in that: the upper layer driver of said 6-DOF micro-positioner uses 4 Lorentz electrical motors; and the under layer driver of the 6-DOF micro-positioner uses 4 Lorentz electrical motors.

A dual-stage exchange system for a lithographic apparatus, characterized in that: the rotor magnetic steels of both upper and under layers drivers of the 6-DOF micro-positioner are fixed at a same frame and suspend in the wafer stage; when the 6-DOF micro-positioners stop operation, the suspending rotor magnetic steels 66 of under layer drivers of the micro-positioners fall upon mechanical zero 67.

A dual-stage exchange system for a lithographic apparatus, characterized in that: linear gratings for position feedback of the 2-DOF driving units are mounted on a guide of upper linear motor and a guide of lower linear motor of said 2-DOF driving units respectively.

A dual-stage exchange system for a lithographic apparatus, characterized in that: said dual-stage exchange system for the lithographic apparatus further comprises a dual frequency laser interferometer for position feedback of wafer stage movement.

ADVANTAGEOUS EFFECTS

Compared with prior art, the present invention has the following significant advantages: First of all, magnetic steels and coils of the two layers of driving units of the 6-DOF micro-positioners of the system's wafer stages are fixed with the wafer stages and the pushrod respectively, hence avoiding extremely high accuracy requirement for assembling. Next, the horizontal direction electromagnetic driving unit has a large air gap between its rotor and stator, which avoids collision during exchange of two stages and relaxes mounting accuracy requirements for system components.

Figure 1:
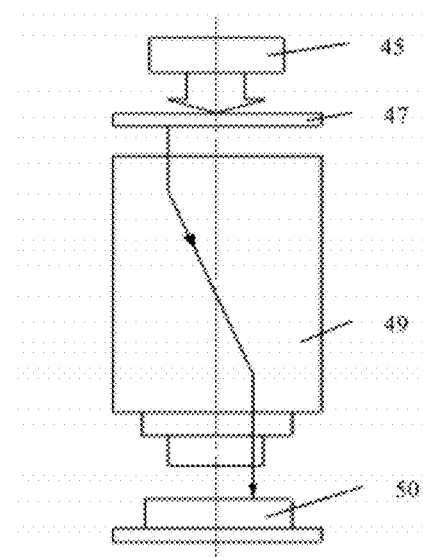
FIG. 1 is a schematic diagram for illustrating operating principle of a lithographic apparatus.

In the drawings:
1-base; 2-top surface of base; 5-linear motor; 6-exposure workstation; 7-pre-processing workstation; 10-first wafer stage; 12-second wafer stage; 21a-X-direction first 2-DOF driving unit; 21b-X-direction second 2-DOF driving unit; 22a-Y-direction first 2-DOF driving unit; 22b-Y-direction second 2-DOF driving unit; 35-pushrod; 45-light source; 47-mask; 49-lens system; 50-wafer; 62-micro-positioner base; 63-upper layer driver stator coil of micro-positioner; 64-upper layer driver rotor magnetic steel of micro-positioner; 65-underlayer driver stator coil of micro-positioner; 66-underlayer driver rotor magnetic steel of micro-positioner; 67-mechanical zero.

DETAIL DESCRIPTION

Figure 2:
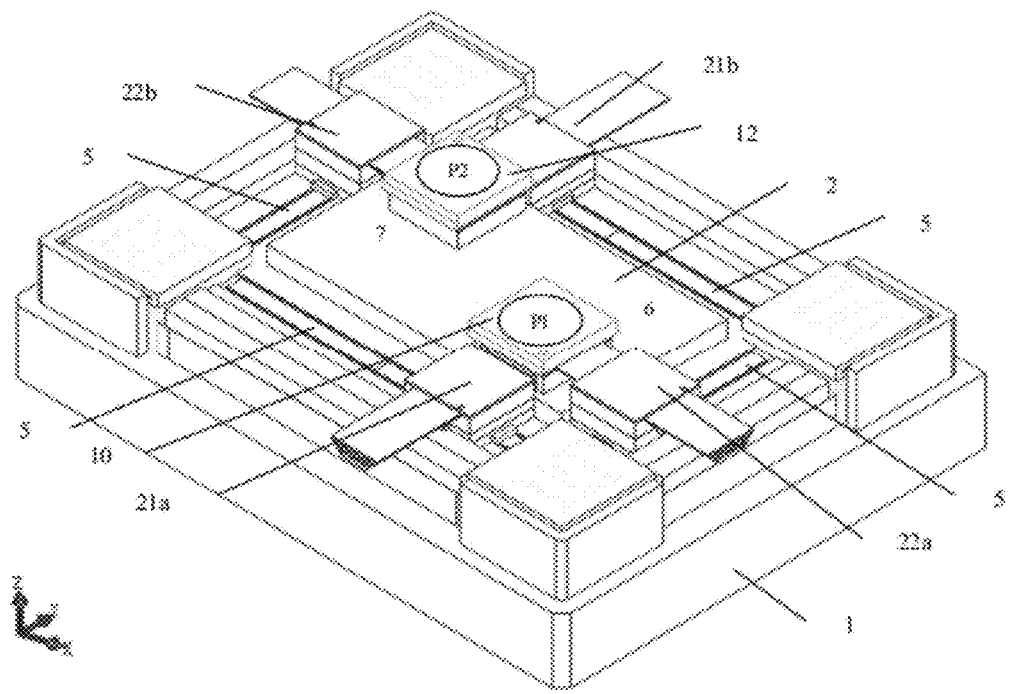
FIG. 2 shows a dual-stage exchange system for a lithographic apparatus provided by the present invention and its state before exchange.

FIG. 2 shows a structural representation of the dual-stage exchange system for a lithographic apparatus. The system includes a base 1 with long sides in X direction and short sides in Y direction, a first wafer stage 10 operating at an exposure workstation 6, a second wafer stage 12 operating at a pre-processing workstation 7 and 4 2-DOF driving units mounted at edges of the base that move in X and Y directions. The two wafer stages are located in a space enclosed by the 4 2-DOF driving units and suspend over a top surface of the base through air bearings. The first X 2-DOF driving unit 21a has a pushrod fixed with a base 62 of the stage's 6-DOF micro-positioner, and the first Y 2-DOF driving unit 22a has a pushrod fixed with an upper layer driver stator coil 63 of the stage's 6-DOF micro-positioner. Similarly, the second X 2-DOF driving unit 21b has a pushrod fixed with a base 62 of the stage's 6-DOF micro-positioner, and the second Y 2-DOF driving unit 22b has a pushrod fixed with an upper layer driver stator coil 63 of the stage's 6-DOF micro-positioner.

Figure 3:
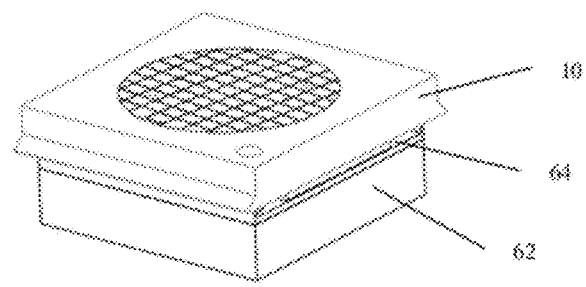
FIG. 3 shows a structure of a wafer stage and a six-degree-of-freedom (6-DOF) micro-positioner.
Figure 4:
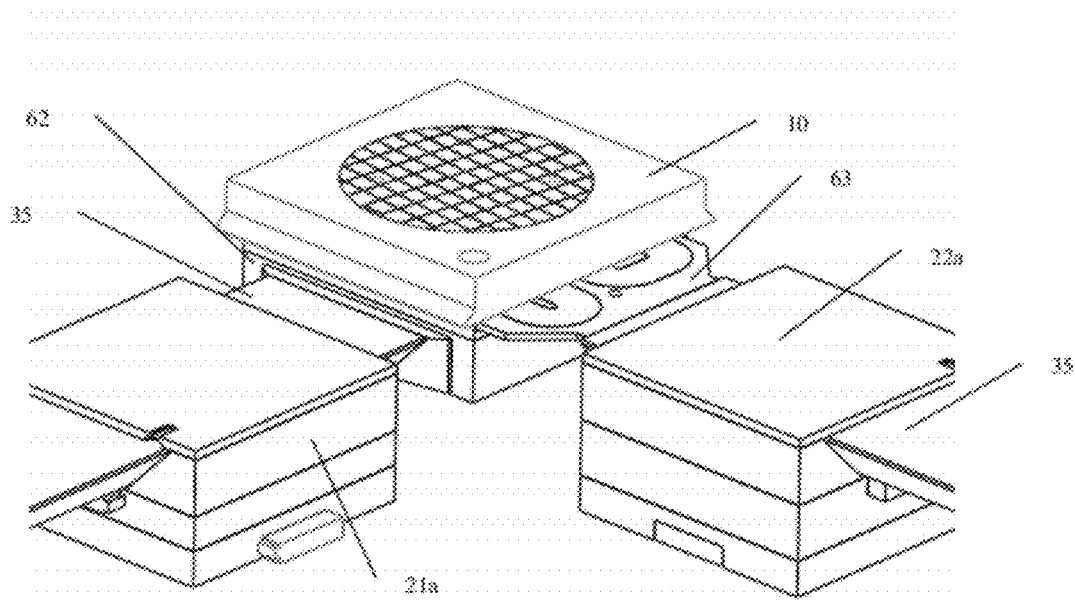
FIG. 4 shows connection between a dual-layer driving structure of 6-DOF micro-positioner of a stage group and a 2-DOF driving unit in a stage group.

FIGS. 3 and 4 show connection between a stage and a 6-DOF micro-positioner and a 2-DOF driving unit. The 6-DOF micro-positioner of the stage has upper and under layers of drivers, which allow 6-DOF micro-positioning of the stage via 8 Lorentz electrical motors. A Lorentz electrical motor is comprised of magnetic steel and coil assembly. The upper layer horizontal direction driving unit allows movements in X, in Y direction and rotation about Z-axis and applies push, pull or twist actions to a stage by controlling 4 Lorentz motors. The under layer vertical direction driving unit allows rotations about X-axis, about Y-axis and movements in Z direction and raises, lowers or twists a stage by controlling acting forces of 4 Lorentz motors.

The first X 2-DOF driving unit 21a has a pushrod fixed with the base 62 of the stage's 6-DOF micro-positioner. An up-and-down linear motor of the first X 2-DOF driving unit 21a drives the first wafer stage 10 to move in X and Y direction. The first Y 2-DOF driving unit 22a has a pushrod fixed with an upper layer driver stator coil 63 of the stage's 6-DOF micro-positioner to drive the stage's 6-DOF micro-positioner for horizontal micro-positioning and cooperate with the first X 2-DOF driving unit 21a's movement on top surface of the base. Similarly, the second X 2-DOF driving unit 21b has a pushrod fixed with a base 62 of the stage's 6-DOF micro-positioner. A up-and-down linear motor of the second X 2-DOF driving unit 21b drives the second wafer stage 12 to move in X and Y direction. The second X 2-DOF driving unit 22b has a pushrod fixed with an upper layer driver stator coil 63 of the stage's 6-DOF micro-positioner to drive the stage's 6-DOF micro-positioner for horizontal micro-positioning and cooperate with the second X 2-DOF driving unit 21b's movement on top surface of the base.

Figure 5:
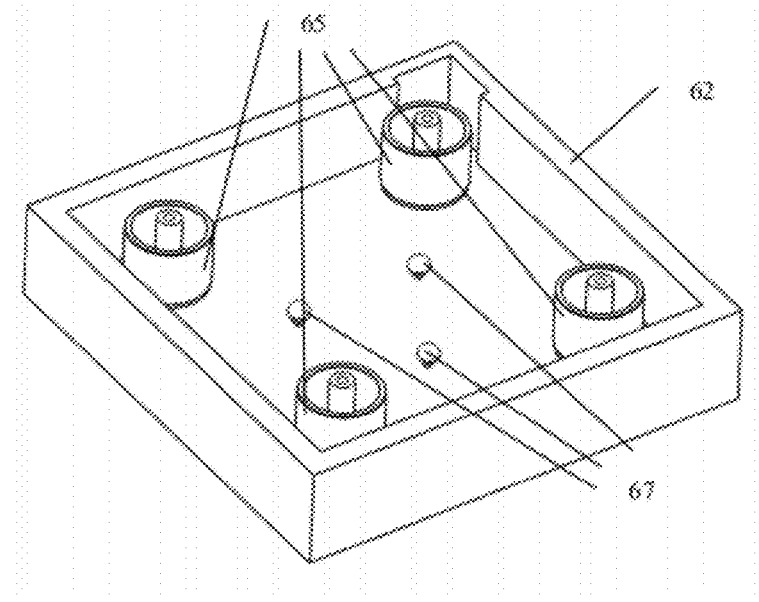
FIG. 5 shows a stator structure of a under layer vertical direction driving unit of the 6-DOF micro-positioner in the stage group.

FIG. 5 shows a stator structure of an under layer vertical direction driving unit of the 6-DOF micro-positioner in the stage. The stage's 6-DOF micro-positioner has upper and under layers of drivers. Rotor magnetic steels of upper and under layers drivers are all fixed to one and the same part and suspend in the wafer stage. The stator coil seat of the upper layer driver is connected with a pushrod of one Y 2-DOF driving unit. The stator coil of the under layer driver is fixed at the wafer stage's base 62. When the two wafer stages are making exchange, the stator coil 63 of the upper layer driver of the stage's 6-DOF micro-positioner withdraws completely from the upper layer driver's rotor 64. In the meanwhile, the under layer driver's stator 65 also stops operation and the suspending magnetic steel rotor 66 falls upon mechanical zero 67.

Figure 6:
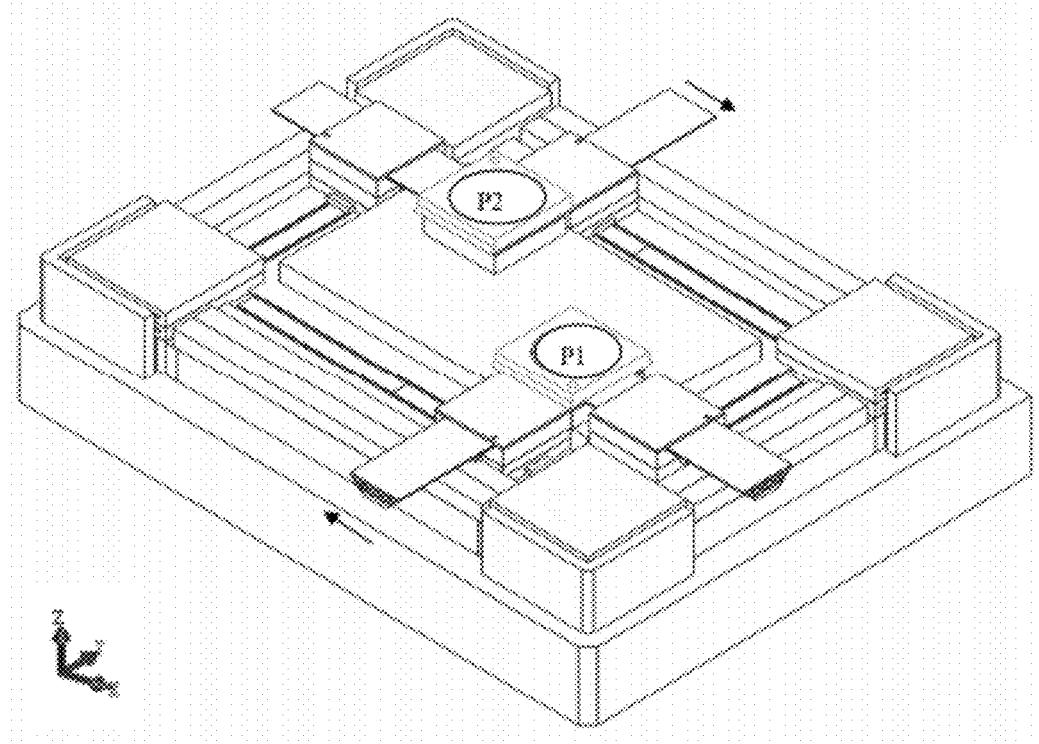
FIG. 6 shows a state in which two stages move to an exchange position before exchange.
Figure 7:
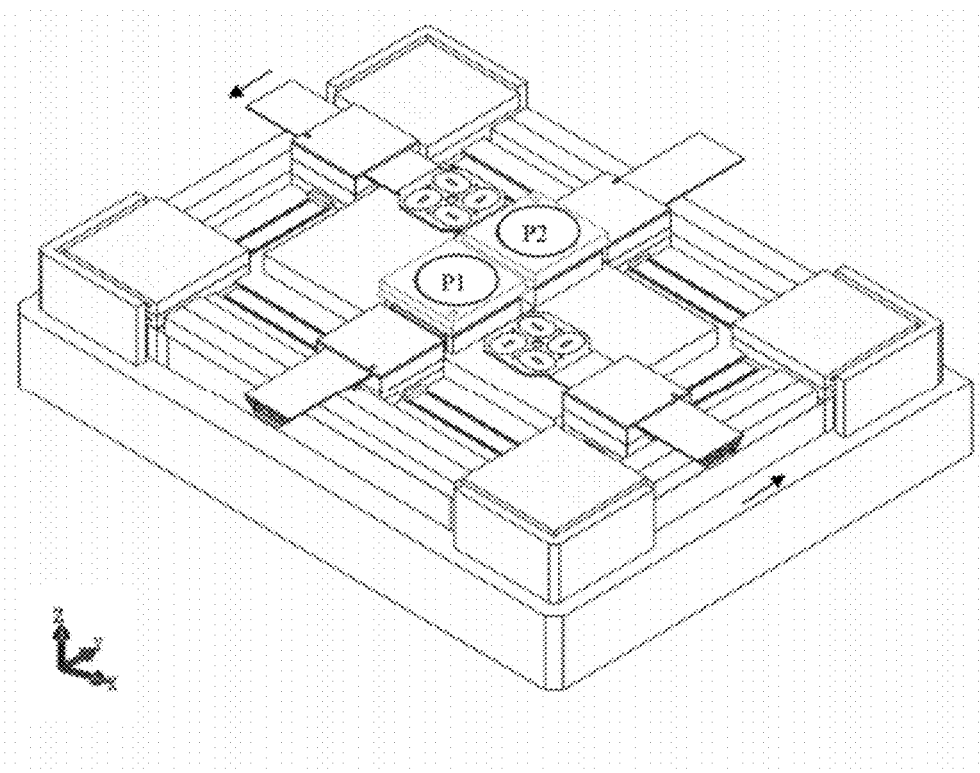
FIGS. 7 and 8 show states in which two wafer stages are exchanging their positions.

FIGS. 6, 7, 8 and 9 show the process in which the system implements exchange of two wafer stages. Before wafer stages 10 and 12 are exchanged, as shown in FIG. 6, the positions that the stages are located at are considered as original positions. The first Y 2-DOF driving unit 22a is connected with the upper layer driver's stator coil 63 of the stage's 6-DOF micro-positioner, and the upper linear guide in the first X 2-DOF driving unit 21a is fixed with micro-positioner's base 62 of the stage 10, so as to drive the wafer stage 10 to experience exposure movement at exposure workstation 6. In the meanwhile, the second Y 2-DOF driving unit 22b is connected with the upper layer driver's stator coil 63 of the stage's 6-DOF micro-positioner, and the upper linear guide in the second X 2-DOF driving unit 21b is fixed with micro-positioner's base 62 of the stage 12, so as to drive the wafer stage 12 to experience pretreatment movement at pre-processing workstation 7.

Figure 8:
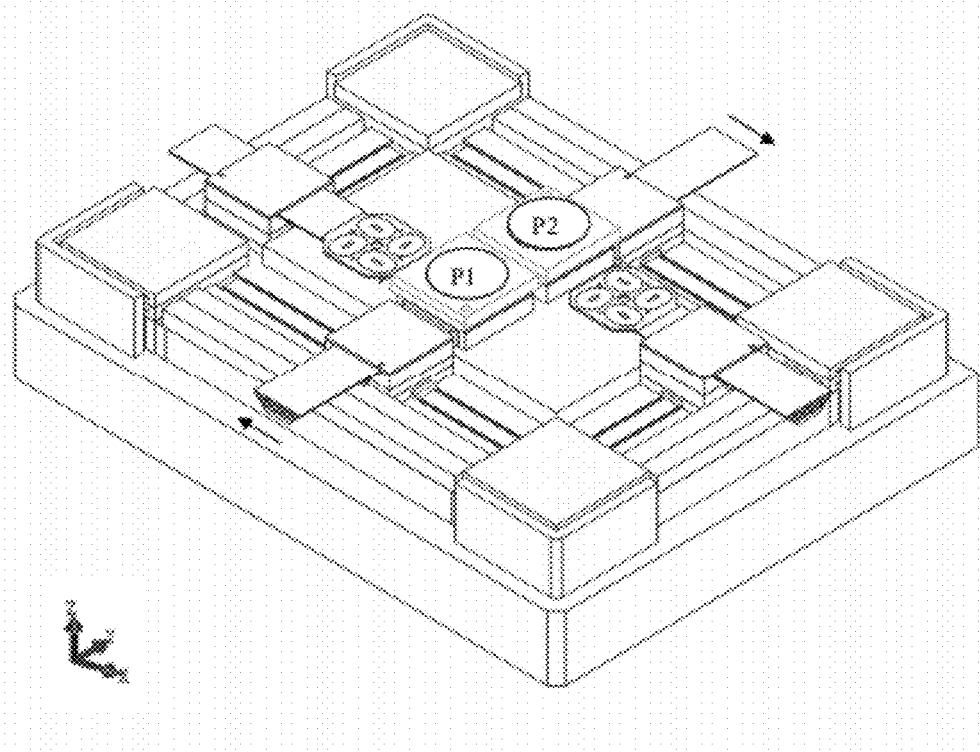
Figure 9:
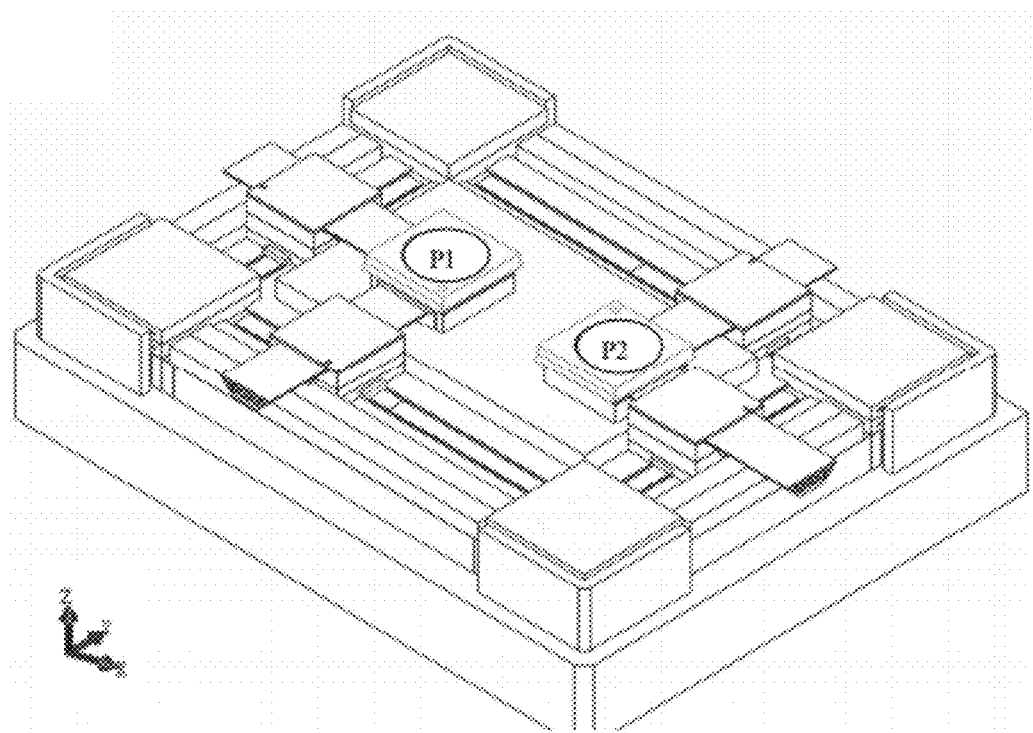
FIG. 9 shows a state in which the system has completed exchange.

After the stages respectively complete pretreatment and exposure procedures, the system enters a two-stage exchange state as shown in FIGS. 8, 9 and 10. At this time, the wafer stage 10 is moved toward the exposure workstation by the first X 2-DOF driving unit 21a through driving by a lower linear guide 30. The first Y 2-DOF driving unit 22a keeps stationary. As the first X 2-DOF driving unit 21a moves, the upper layer rotor coil of the stage's 6-DOF micro-positioner fixed with the pushrod of the first Y 2-DOF driving unit 22a withdraws from the wafer stage 10. The another wafer stage 12 is moved toward the exposure workstation by the second X 2-DOF driving unit 21b through driving by the lower linear guide 30. The second Y 2-DOF driving unit 22b keeps stationary. As the second X 2-DOF driving unit 21b moves, the upper layer rotor coil of the stage's 6-DOF micro-positioner fixed with the pushrod of the second Y 2-DOF driving unit 22b withdraws from the wafer stage 12.

When the two stages move in X direction to the locations shown in the Figures, respectively, the first Y 2-DOF driving unit 22a starts to move right in Y direction and the second Y 2-DOF driving unit 22b starts to move left in Y direction, until they are respectively aligned with upper layer stator gaps of the two stage's 6-DOF micro-positioners just sufficiently for insertion. The two X 2-DOF driving units drive the two wafer stages 10 and 12 respectively to continue moving in X direction until the two rotor coils are inserted in place. So far position exchange between two stages is completed and the system enters the next cycle.

The invention claimed is:

1. A dual-stage exchange system for a lithographic apparatus, the system comprising, a first wafer stage (10) operating at an exposure workstation (6) and a second wafer stage (12) operating at a pre-processing workstation (7), each of the wafer stages being borne by a 6-DOF micro-positioner respectively, a wafer stage and a 6-DOF micro-positioner constituting a stage group, the 6-DOF micro-positioner being driven by Lorentz motors, said two wafer stages being disposed on a top surface (2) of a rectangular base with its long sides in X direction and its short sides in Y direction, a first X 2-DOF driving unit (21a) and a second X 2-DOF driving unit (21b) being disposed on two long sides of the base (1) respectively and a first Y 2-DOF driving unit (22a) and a second Y 2-DOF driving unit (22b) being disposed on two short sides of the base (1) respectively, the 2-DOF driving units being driven by upper linear motors and lower linear motors, characterized in that: the 6-DOF micro-positioner of each stage group has upper and under layers of drivers with the upper layer being horizontal direction driver and the under layer being vertical direction driver, the upper layer driver allows movements in X direction, in Y direction and rotation about Z axis, the under layer driver allows movement in Z direction, rotation about X axis and rotation about Y axis; a base of the 6-DOF micro-positioner (62) is fixed with a pushrod (35) of the first X 2-DOF driving unit (21a), and a stator coil (63) of the upper layer driver of the 6-DOF micro-positioner is fixed with a pushrod (35) of the first Y 2-DOF driving unit (22a);

the exchange process for the two wafer stages of the system is as follows: upon exchange, firstly, stator coils (63) of upper layer drivers of the two stage groups' 6-DOF micro-positioners separate completely from rotor magnetic steels (64) of corresponding upper layer drivers respectively, the stator coils (63) of upper layer drivers of the two 6-DOF micro positioners are not exchanged, the two wafer stages exchange positions, then, the stator coil (63) of the upper layer driver of the 6-DOF micro-positioner located at the exposure workstation is inserted into a gap of the rotor magnetic steel (64) of the upper layer driver of the 6-DOF micro-positioner that moved to the exposure workstation, the stator coil (63) of the upper layer driver of the 6-DOF micro-positioner located at the pre-processing workstation is inserted into a gap of the rotor magnetic steel (64) of the upper layer driver of the 6-DOF micro-positioner that moved to the pre-processing workstation, after that the system enters a next operating cycle.

2. The dual-stage exchange system for a lithographic apparatus according to claim 1, characterized in that: the upper layer driver of said 6-DOF micro-positioner uses at least 3 Lorentz electrical motors; and the under layer driver uses at least 3 Lorentz electrical motors.

3. The dual-stage exchange system for a lithographic apparatus according to claim 2, characterized in that: the upper layer driver of said 6-DOF micro-positioner uses 4 Lorentz electrical motors; and the under layer driver of the 6-DOF micro-positioner uses 4 Lorentz electrical motors.

4. The dual-stage exchange system for a lithographic apparatus according to claim 1, characterized in that: the rotor magnetic steels of both upper and under layers drivers of the 6-DOF micro-positioner are fixed at a same frame and suspend in the wafer stage; when the 6-DOF micro-positioners stop operation, the suspending rotor magnetic steels (66) of under layer drivers of the micro-positioners fall upon mechanical zero (67).

5. The dual-stage exchange system for a lithographic apparatus according to claim 1, characterized in that: linear gratings for position feedback of the 2-DOF driving units are mounted on a guide of upper linear motor and a guide of lower linear motor of said 2-DOF driving units respectively.

6. The dual-stage exchange system for a lithographic apparatus according to claim 1, characterized in that: said dual-stage exchange system for the lithographic apparatus further comprises a dual frequency laser interferometer for position feedback of wafer stage movement.

* * * * *